(12) United States Patent
Eno et al.

(10) Patent No.: US 11,048,597 B2
(45) Date of Patent: Jun. 29, 2021

(54) MEMORY DIE REMAPPING

(71) Applicant: Micron Technology, Inc., Boise, ID (US)

(72) Inventors: Justin Eno, El Dorado Hills, CA (US); Samuel E. Bradshaw, Sacramento, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 341 days.

(21) Appl. No.: 15/979,269

(22) Filed: May 14, 2018

(65) Prior Publication Data
US 2019/0347151 A1 Nov. 14, 2019

(51) Int. Cl.
*G06F 11/00* (2006.01)
*G06F 11/16* (2006.01)
*G06F 11/07* (2006.01)
*G11C 29/00* (2006.01)
(Continued)

(52) U.S. Cl.
CPC ........ *G06F 11/1666* (2013.01); *G06F 11/079* (2013.01); *G06F 11/0727* (2013.01); *G06F 11/0793* (2013.01); *G11C 29/76* (2013.01); *G06F 3/0619* (2013.01); *G06F 3/0635* (2013.01); *G06F 3/0673* (2013.01);
(Continued)

(58) Field of Classification Search
CPC ..... H01L 27/0688; H01L 23/48; H01L 25/18; G06F 3/061; G06F 11/1044; G06F 12/0246; G06F 12/0253; G06F 2212/7201; G06F 2212/7205; G06F 2212/7211; G06F 11/0727; G06F 11/1666; G11C 29/76
See application file for complete search history.

(56) References Cited

U.S. PATENT DOCUMENTS 5,613,061 A * 3/1997 Taylor ................. G06F 11/2294
714/30
7,379,316 B2 * 5/2008 Rajan ....................... G11C 5/02
365/63
7,916,421 B1 3/2011 Liikanen et al.
(Continued)

FOREIGN PATENT DOCUMENTS

WO 2016/023003 A2 2/2016

OTHER PUBLICATIONS

International Search Report and Written Opinion, PCT App. No. PCT/US2018/045343, dated Nov. 27, 2018, 12 pages.

*Primary Examiner* — Michael Maskulinski
(74) *Attorney, Agent, or Firm* — Nicholson De Vos Webster & Elliott LLP

(57) ABSTRACT

Exemplary methods, apparatuses, and systems include a controller detecting a trigger to configure a memory. The memory includes a plurality of dice, including two or more spare dice. The controller accesses each die via one of a plurality of channels. The controller accesses a first spare die via a first channel and the second spare die via a second channel. In response to detecting the trigger, the controller maps a plurality of logical units to the plurality of dice, excluding the two spare dice. The mapping includes mapping each logical unit of the plurality of logical units across multiple dice of the plurality of dice, such that a first half of the plurality of logical units reside on dice accessible via channels other than the first channel and a second half of the plurality of logical units reside on dice accessible via channels other than the second channel.

20 Claims, 3 Drawing Sheets

(51) Int. Cl.
*G06F 3/06* (2006.01)
*G06F 12/06* (2006.01)

(52) U.S. Cl.
CPC .......... *G06F 11/0751* (2013.01); *G06F 12/06* (2013.01); *G06F 2212/1016* (2013.01)

(56) References Cited

U.S. PATENT DOCUMENTS

| | | | |
|---|---|---|---|
| 10,318,381 B2 | 6/2019 | Eno et al. | |
| 10,445,195 B2 | 10/2019 | Bradshaw et al. | |
| 2004/0085849 A1 | 5/2004 | Myoung et al. | |
| 2004/0093472 A1* | 5/2004 | Dahlen | G06F 11/2061 711/158 |
| 2005/0204187 A1 | 9/2005 | Lee et al. | |
| 2008/0013380 A1* | 1/2008 | Cornwell | G11C 16/3431 365/185.21 |
| 2008/0082736 A1 | 4/2008 | Chow et al. | |
| 2010/0153620 A1 | 6/2010 | McKean et al. | |
| 2010/0332894 A1 | 12/2010 | Bowers et al. | |
| 2011/0090004 A1* | 4/2011 | Schuetz | H01L 23/481 327/564 |
| 2011/0320698 A1* | 12/2011 | Wang | G06F 13/1663 711/105 |
| 2013/0061087 A1 | 3/2013 | Kopylovitz | |
| 2014/0082411 A1* | 3/2014 | Warnes | G11C 29/88 714/6.3 |
| 2014/0173378 A1* | 6/2014 | O'Connor | G06F 11/1048 714/758 |
| 2014/0189421 A1* | 7/2014 | Werner | G06F 3/0688 714/6.21 |
| 2014/0376320 A1 | 12/2014 | Loh et al. | |
| 2015/0194224 A1* | 7/2015 | Jeddeloh | H01L 25/18 714/723 |
| 2015/0234719 A1 | 8/2015 | Coronado et al. | |
| 2016/0124642 A1 | 5/2016 | Kim et al. | |
| 2016/0147623 A1 | 5/2016 | Ping et al. | |
| 2016/0170672 A1 | 6/2016 | Li et al. | |
| 2016/0170898 A1 | 6/2016 | Lee | |
| 2016/0363626 A1* | 12/2016 | How | G06F 11/1625 |
| 2017/0091115 A1 | 3/2017 | Xiao et al. | |
| 2017/0132125 A1 | 5/2017 | Cai et al. | |
| 2017/0147435 A1* | 5/2017 | Werner | G06F 11/2056 |
| 2017/0220273 A1 | 8/2017 | Yang | |
| 2017/0300422 A1 | 10/2017 | Szubbocsev | |
| 2018/0143902 A1 | 5/2018 | Hong | |
| 2018/0157415 A1* | 6/2018 | Choi | G06F 3/0655 |
| 2018/0189144 A1 | 7/2018 | Song et al. | |
| 2018/0239547 A1 | 8/2018 | Inbar et al. | |
| 2018/0373642 A1 | 12/2018 | Yang et al. | |
| 2018/0374557 A1* | 12/2018 | Jeddeloh | G11C 29/44 |
| 2019/0196921 A1* | 6/2019 | Verkaik | G06F 11/00 |
| 2019/0205225 A1* | 7/2019 | Kim | G06F 13/4239 |
| 2019/0206477 A1* | 7/2019 | Kim | G11C 16/0483 |
| 2020/0004629 A1* | 1/2020 | Zamir | G06F 3/0619 |

\* cited by examiner

FIG. 2

| Die\Channel | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0 | 0 | 0 | 0 | 0 | 0 | 0 | 0 | 0 | 1 | 1 | 1 | 1 | 1 | 1 | 1 |
| 1 | 1 | 1 | 2 | 2 | 2 | 2 | 2 | 2 | 2 | 2 | 2 | 3 | 3 | 3 | 3 | 3 |
| 2 | 3 | 3 | 3 | 3 | 4 | 4 | 4 | 4 | 4 | 4 | 4 | 4 | 4 | 5 | 5 | 5 |
| 3 | 5 | 5 | 5 | 5 | 5 | 5 | 6 | 6 | 6 | 6 | 6 | 6 | 6 | 6 | 6 | XX |
| 4 | 7 | 7 | 7 | 7 | 7 | 7 | 7 | 7 | 8 | 8 | 8 | 8 | 8 | 8 | 8 | 8 |
| 5 | 8 | 8 | 9 | 9 | 9 | 9 | 9 | 9 | 9 | 9 | 9 | 10 | 10 | 10 | 10 | 10 |
| 6 | 10 | 10 | 10 | 10 | 11 | 11 | XX | 11 | 11 | 11 | 11 | 11 | 11 | 12 | 12 | 12 |
| 7 | 12 | 12 | 12 | 12 | 12 | 12 | 13 | 13 | 13 | 13 | 13 | 13 | 13 | 13 | 13 | 13 |

200

| Register | Value |
|---|---|
| DIE_SPARE_0 | 0x81 |
| DIE_SPARE_1 | 0x67 |

205

MEMORY DIE REMAPPING

FIELD OF THE INVENTION

The various embodiments described in this document relate to managing memory devices. In particular, embodiments include a controller configuring spare dice and remapping dice within the user space of a memory to utilize the spare dice.

BACKGROUND OF THE INVENTION

Storage media experience time-zero/factory defects, grown defects, endurance-related errors, and transient errors. In packages that include multiple dice, a defective die may lead to disposal of a package with many non-defective dice. Error detection and correction techniques such as, e.g., error-correcting codes and other techniques that utilize redundant and/or parity data, can correct some errors. The capabilities of such techniques, however, are limited. For example, these techniques may only be capable of detecting and correcting a finite quantity (e.g., number or distribution) of erroneous data. If this limit is exceeded, the erroneous data may not be correctable and may become corrupted and/or lost.

BRIEF DESCRIPTION OF THE DRAWINGS

The present invention is illustrated by way of example and not limitation in the figures of the accompanying drawings, in which like references indicate similar elements, and in which:

FIG. 2 illustrates, in block diagram form, a mapping of logical units to dice within a memory system including spare dice and a data structure to track remapping of spare dice.

DETAILED DESCRIPTION

This document describes embodiments that map and remap spare dice within a non-volatile memory or another storage medium system. A controller initially maps logical units to the plurality of dice in a manner that avoids channel stacking when the controller subsequently remaps logical units (or portions thereof) to the spare dice. As described further in this document, channel stacking refers to a mapping in which more than one die in a parity-protected stripe exists on a single physical controller channel. Dynamic remapping of logical units to spare dice allows for a runtime "best foot forward" type media management strategy. For example, storage media errors and defects commonly manifest as errors tracked, e.g., as a part of a bit error rate. Thus, the bit error rate, when captured in a normalized fashion, can be used to rank and/or rate the logical and physical elements in a storage medium topology. The rank or rating of elements identifies those elements contributing the largest bit errors. In a topology characterized by multiple dice attached via multiple physical channels, a remapping scheme driven by a bit error rate with one or more spare dice provides die-level redundancy, affording both robustness to errors at the bit/byte-level localized to a die, logical page(s) on a die, the die itself, and/or channel-level redundancy. Additionally, regular or periodic sampling of the bit error rate enables the controller to remap spare dice dynamically. As a result, embodiments identify dice (or other memory devices) that are initially defective as well as subject to runtime endurance fails, effectively remediating errors and failures over the lifespan of the media usage.

Figure 1:
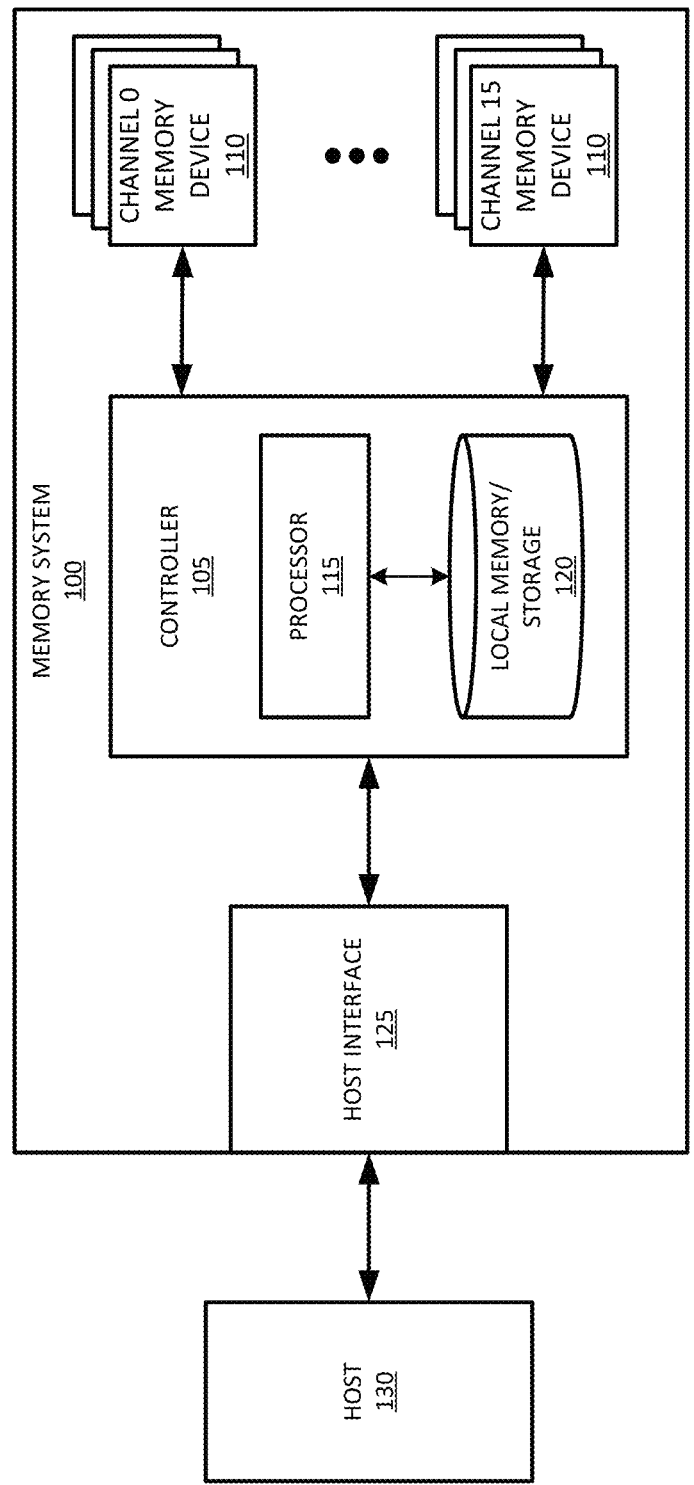
FIG. 1 illustrates, in block diagram form, a memory including a controller to map and remap memory dice.

FIG. 1 illustrates, in block diagram form, memory system 100 including controller 105 to map and remap memory devices 110. The memory system 100 can include volatile memory devices, non-volatile memory devices, or a combination of volatile and non-volatile memory devices. In one embodiment, memory devices 110 are dice that provide storage media for memory system 100 which may, in turn, provide storage for host 130. For example, each die 110 may provide three-dimensional phase change material and switching (PCMS) memory, a solid-state drive memory, or another type of storage media. In one embodiment, memory devices 112A-112N are a cross-point array of non-volatile memory cells. Cross-point non-volatile memory can perform bit storage based on a change of bulk resistance, in conjunction with a stackable cross-gridded data access array. Additionally, cross point non-volatile memory can perform a write in-place operation (in contrast to many Flash-based memory), where a non-volatile memory cell may be programmed without the non-volatile memory cell being previously erased.

Controller 105 couples to dice 110 via a plurality of channels. In one embodiment, memory system 100 includes sixteen channels with eight dice per channel, for a total of one hundred twenty-eight dice. In another embodiment, memory system 100 includes another configuration of channels and dice.

Controller 105 includes processor 115 and local memory and/or storage 120. Processor 115 may be a central processing unit, microprocessor, integrated circuit, field programmable gate array, or other circuitry (collectively referred to herein as a processing device) to read, write, and maintain memory content as well as perform the embodiments set forth in this document and described, e.g., with reference to FIGS. 2-3. Local memory/storage 120 stores instructions, software, firmware, and/or data for controller 105 to execute in managing dice 110. For example, local memory/storage 120 may include one or more hardware registers, static random-access memory (SRAM), dynamic random-access memory (DRAM), and/or another storage medium. In on embodiment, processor 115 stores logical unit mapping data in local memory/storage 120.

Memory system 100 further includes host interface 125. Host interface 125 provides an interface for passing control, address, data, and other signals between the memory system 100 and host 130. In one embodiment, host interface includes a serial advanced technology attachment (SATA) interface, peripheral component interconnect express (PCIe) interface, PCIe endpoint, universal serial bus (USB), Fibre Channel, Serial Attached SCSI (SAS), or another set of one or more connectors, input/output circuits, and/or interfaces. The host system 130 can further utilize an NVM Express (NVMe) interface to access the memory devices 110 when the memory system 100 is coupled with the host system 130 by the PCIe interface. In some embodiments, the memory system 100 is a hybrid memory/storage system.

Host 130 may be a laptop, desktop, server, or other computing device that utilizes memory system 100. In one embodiment, host 130 includes a motherboard or backplane to couple to memory system 100 via host interface 125.

FIG. 2 illustrates, in block diagram form, mapping 200 of logical units to dice within a memory system including spare dice and data structure 205 to track remapping of spare dice. In one embodiment, controller 105 manages the logical division of physical die 110 and other mapping of logical units to physical dice 110. For example, controller 105 may define a page as an addressable unit of 16 bytes and a write unit (WU) as three pages on each of sixteen partitions of a single die (i.e., a total of 48 pages or 768 bytes). Additionally, controller 105 may define a managed unit (MU) or stripe as nine WUs, one of which is a parity WU. Alternatively, controller 105 may define different logical divisions of physical dice 110. Controller 105 includes memory space corresponding to MUs, or similar logical units, as a part of the total memory space reported to the user. Controller 105 omits the two spare dice from the memory capacity reported to a user (e.g., labelled "XX" in mapping 200).

Mapping 200 is a representation of memory system 100 having 128 dice, with 8 dice per channel and 16 channels. Each box in mapping 200 is a logical representation of an individual die 110. The numbers in the boxes represent a logical unit group, such as a MU or RAID (redundant array of independent disks) stripe. Mapping 200 illustrates 14 MUs, numbered 0 through 13. A smaller or larger topology (e.g., 16 channels with 16 dice per channel), will have a different number of groupings. Laying out each MU across different channels provides data integrity robustness in the face of a channel failure and enables controller 105 to access each die 110 within the MU in parallel. For example, if two dice 110 communicated with controller 105 via the same channel and each die 110 stored a portion of the same MU (referred to as channel stacking), controller 105 would need to access the two dice 110 sequentially and, in the case of a failure of the channel, may not be able to recover the MU. A channel failure may include, e.g., a bit line or word line short in a stacked die architecture in which the bus lines go to all dice on the channel.

Mapping 200 illustrates an initial mapping to account for spare dice, labelled "XX." Mapping 200 illustrates an example in which controller 105 maps logical units to physically contiguous dice 110 with a placement of spare dice 110 to avoid channel stacking. For example, mapping 200 illustrates half of the dice as unshaded boxes and the other half of dice as shaded boxes. Mapping 200 provides one spare die 110 for each group. The spare die located in the die 3 position of channel 15 is unshaded because none of the unshaded logical units of MUs 0, 2, 4, 6, 7, 9, and 11 includes a WU on channel 15. As a result, controller 105 can remap a WU represented as an unshaded die to the spare die located in die 3 position of channel 15 without channel stacking. Similarly, the spare die located in the die 7 position of channel 6 is shaded because none of the shaded logical units of MUs 1, 3, 5, 8, 10, 12, and 13 includes a WU on channel 6. As a result, controller 105 can remap a WU represented as a shaded die to the spare die located in die 7 position of channel 6 without channel stacking. In a memory topology constructed with a power-of-2 number of channels (e.g., 16 as illustrated) with a symmetric number of dice per channel, as may be preferred when dice are stacked into packages in power-of-2 counts, one embodiment employs a ratio of 63 mapped die per singe spare die. With a 63:1 ratio, a 16 channel with 8 dice per channel topology would have 2 spare dice, as illustrated by mapping 200. Similarly, a 16 channel with 16 dice per channel topology would have 4 spare dice, and so on. In one embodiment, a topology with 4 or more spare dice provides two or more spare dice per group of WUs. For example, a topology with 4 spare dice may provide one spare die to each quarter of the WUs. Once one die in a MU has been remapped, however, controller 105 will not remap any other dice in the MU to avoid channel stacking.

To implement this initial mapping, the logical-to-physical relationship can be distilled into a set of constants that define at which logical die addresses must be offset. For example, using the 63:1 ratio and illustrated topology, controller 105 may use constants that represent the demarcation between the bands of shifts: a spare following the first 63 dice mapped to user space addresses (e.g., the $64^{th}$ die), another spare following the next 54 dice (e.g., the $118^{th}$ die), etc.

Data structure 205 tracks remapping of spare dice. One embodiment implements data structure 205 using one register per spare die. In another embodiment, memory system 100 uses a memory or other local storage 120 to track remapping of dice. For simplicity, embodiments described in this document refer to registers.

Initially, controller 105 writes a value to each register to indicate that the spare dice are available/not mapped to the user space of the memory. For example, each register represents one spare die and the register initially stores the die address for the corresponding spare die or another identity map for the spare die. This identity map is semantically equivalent to an unused entry. An address translation sequence will not produce a physical die address matching that value. Thus, the entry will not produce a die remap operation (e.g., as described with reference to FIG. 3) until controller 105 reprograms the value in the register to include an address or other identification of a remapped die. Using an example in which the address translation maps a first hexadecimal digit to the channel and the second hexadecimal digit to the die within that channel. For example, an eight-bit hexadecimal representation may include a channel value shifted into the upper four bits and a die value in the lower four bits. In an embodiment with a greater number of channels or dice, the representation would include a higher order of bits (e.g., a nine-bit hexadecimal number). The following illustrates exemplary initial values for mapping 200: (1) the register for the first spare (die 3 position of channel 15) has an initialization value of 0xF3 to represent the implied target/identity mapping of channel 15, die 3, and (2) the register for the second spare (die 7 of channel 6) has an initialization value of 0x67 to represent the implied target/identity mapping of channel 6, die 7. Once a die is remapped, as described with reference to FIG. 3, controller 105 writes the address or other identification of the die remapped to the spare to the corresponding register. For example, data structure 205 illustrates the remapping of the MU on channel 8, die 1 to the first spare die (implied by the register to refer to the channel 15, die 3) while maintaining an identity mapping for the second spare die (channel 6, die 7).

Figure 3:
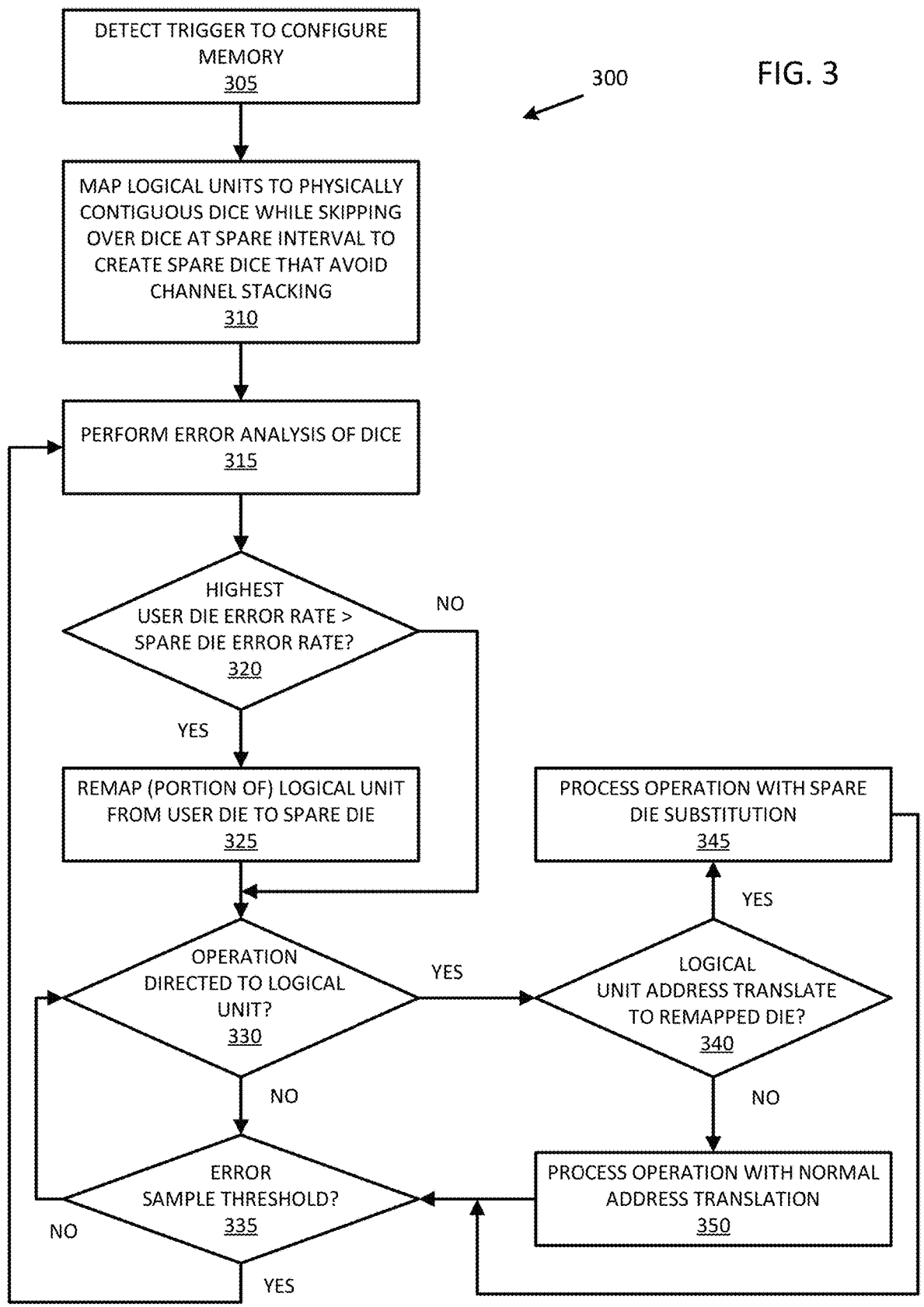
FIG. 3 is a flow chart illustrating an exemplary method of configuring spare dice and remapping logical units of memory to use the spare dice.

FIG. 3 is a flow chart illustrating exemplary method 300 of configuring spare dice and remapping logical units of memory to use the spare dice. At block 305, controller 105 detects a trigger to configure memory system 100. For example, controller 105 may detect a request from host 130 to format or otherwise configure memory devices/dice 110 for use by host 130. Alternatively, controller 105 detects an initial boot up as the trigger.

At block 310, in response to the detected trigger, controller 105 maps logical units to dice 110. For example, as described with reference to FIG. 2, controller 105 maps logical units to physically contiguous dice while skipping spare dice 110 placed to avoid channel stacking. Mapping 200 uses a user dice to spare ratio of 63:1. In other words, controller 105 skips 1 out of every 64 dice 110 when mapping logical units. In mapping 200, controller 105 maps logical units to the first 63 physically contiguous dice 110, skips the 64$^{th}$ die 110 used as a spare, maps logical units to the next 54 physically contiguous dice 110, skips the 55$^{th}$ die 110 used as a spare, and maps logical units to the next 9 physically contiguous dice 110. Avoiding channel stacking through the placement of spare dice is dependent upon the number of channels and dice 110. Thus, the skipping of dice 110 when mapping logical units to avoid channel stacking with spare dice may vary depending upon the number of channels and total number of dice 110 in the topology of memory system 100.

At block 315, controller 105 performs an error analysis of dice 110. For example, controller 105 may include a suite of functionality deemed the "scrubber." At a high level, the scrubber is a continuous background process that is responsible for determining the Bit Error Rates (BER) of various physical and/or logical divisions of the memory media, ranking the divisions, e.g., highest-to-lowest BER, and rewriting the data on the system according to the ranking, e.g., to migrate away from high-BER media and toward low-BER media. In one embodiment, the scrubber determines the Raw Bit Error Rate (RBER) for the divisions of memory media and controller 105 accumulates the RBER values in per-die buckets and spare die logical unit groupings (e.g., mapping 200 includes two spare die groups, one shown as shaded squares and the other as unshaded squares). Controller 105 uses the sorted RBER values to select the worst-performing die for each spare die group.

At block 320, controller 105 determines if the worst-performing user space die 110 in each spare die group has a higher BER than the corresponding spare die 110. For example, referring to FIG. 2, controller 105 may determine that die in position 1 on channel 8 has the highest BER of dice 110 in MUs 0, 2, 4, 6, 7, 9, and 11 and a higher BER than the spare die in position 3 on channel 15 for that group of MUs.

If the worst-performing user space die 110 in each spare die group has a higher BER than the corresponding spare die 110, at block 325, controller 105 remaps the logical unit (or portion thereof) from the poorly-performing die 110 to the spare die 110. In one embodiment, the remapping includes controller 105 writing the contents of the poorly-performing die 110 to the spare die 110 and tracking the remapping in data structure 205. Following the example above, controller 105 writes an address or other identifier (e.g., 0x81) for the die in position 1 on channel 8 to the register or data structure entry representing the spare die for that group of MUs. In one embodiment, a die is remapped if its BER is simply greater than the BER of the spare die. In another embodiment, a die is remapped if its BER is greater than the BER of the spare die by a threshold amount. In another embodiment, a die is remapped if its BER is greater than the BER of the spare die and above a threshold BER value.

After the remapping and/or if controller 105 bypasses remapping due to the user die BER not exceeding the spare die BER or another threshold, at block 330, controller 105 determines if it has received an operation directed to a logical unit (e.g., an MU). For example, an operation may be a command from host 130 instructing controller 105 to read or write an MU.

If no operation is received, at block 335, controller 105 determines if an error sampling threshold has been reached. For example, controller 105 may perform the error analysis of the dice 110 at a periodic interval and await the expiration of a threshold period before initiating another analysis.

If the error sampling threshold has been reached, method 300 returns to block 315 to sample the BER for dice 110 again. Alternatively, the scrubber continually performs the error analysis and bypasses block 335 to return to block 315. If the error sampling threshold has not been reached, method 300 returns to block 330 to determine if a memory operation has been received.

If controller 105 receives an operation directed to a logical unit, at block 340, controller 105 determines if the operation is directed to a remapped logical unit. For example, controller 105 determines if the operation includes a logical unit address that translates to a remapped die 110. In one embodiment, this determination includes comparing the translation of the logical unit address to data structure 205. If data structure 205 includes an entry having an identifier that matches or otherwise corresponds to the translated logical unit address, controller 105 detects that the operation is directed to a remapped die. With each register or entry in data structure 205 representing a particular spare die 110, controller 105 determines the spare die 110 to use based upon the inclusion of the remapped die identifier in the specific register/data structure entry. In an alternate embodiment, controller 105 maintains a data structure with an entry for each user space die and looks up each logical unit translation by indexing the corresponding user space die that is a target of the operation. If the entry for a given user space die includes an identifier for a spare die, controller 105 detects that the operation is directed to a remapped die and uses the spare die identifier to process the operation.

If the operation is directed to a remapped die, at block 345, controller 105 processes the operation by substituting the spare die for the remapped user space die that resulted from the logical unit address translation. If the operation is not directed to a remapped die, at block 345, controller 105 processes the operation normally (e.g., without substituting the spare die for any user space dice that resulted from the logical unit address translation).

Subsequent to, or in parallel to the processing of the operation, method 300 returns to block 335.

It will be apparent from this description that aspects of the inventions may be embodied, at least in part, in software or firmware. That is, a computer system or other data processing system, such as controller 105 of memory system 100, may carry out the computer-implemented method 300 in response to its processor or other circuitry executing sequences of instructions contained in memory 120 or another non-transitory machine-readable storage medium. The software may further be transmitted or received over a network (not shown) via a network interface. In various embodiments, hardwired circuitry may be used in combination with the software instructions to implement the present embodiments. It will also be appreciated that additional components, not shown, may also be part of memory system 100, and, in some embodiments, fewer components than that shown in FIG. 1 may also be used in memory system 100.

An article of manufacture may be used to store program code providing at least some of the functionality of the embodiments described above. Additionally, an article of manufacture may be used to store program code created using at least some of the functionality of the embodiments described above. An article of manufacture that stores program code may be embodied as, but is not limited to, one or more memories (e.g., one or more flash memories, random access memories—static, dynamic, or other), optical disks, CD-ROMs, DVD-ROMs, EPROMs, EEPROMs, magnetic or optical cards or other type of non-transitory machine-readable media suitable for storing electronic instructions.

Additionally, embodiments of the invention may be implemented in, but not limited to, hardware or firmware utilizing an FPGA, ASIC, a processor, a computer, or a computer system including a network. Modules and components of hardware or software implementations can be divided or combined without significantly altering embodiments of the invention.

In the foregoing specification, the invention has been described with reference to specific exemplary embodiments thereof. Various embodiments and aspects of the invention(s) are described with reference to details discussed in this document, and the accompanying drawings illustrate the various embodiments. The description above and drawings are illustrative of the invention and are not to be construed as limiting the invention. References in the specification to "one embodiment," "an embodiment," "an exemplary embodiment," etc., indicate that the embodiment described may include a particular feature, structure, or characteristic, but not every embodiment may necessarily include the particular feature, structure, or characteristic. Moreover, such phrases are not necessarily referring to the same embodiment. Furthermore, when a particular feature, structure, or characteristic is described in connection with an embodiment, such feature, structure, or characteristic may be implemented in connection with other embodiments whether or not explicitly described. Additionally, as used in this document, the term "exemplary" refers to embodiments that serve as simply an example or illustration. The use of exemplary should not be construed as an indication of preferred examples. Blocks with dashed borders (e.g., large dashes, small dashes, dot-dash, dots) are used to illustrate optional operations that add additional features to embodiments of the invention. However, such notation should not be taken to mean that these are the only options or optional operations, and/or that blocks with solid borders are not optional in some embodiments of the invention. Numerous specific details are described to provide a thorough understanding of various embodiments of the present invention. However, in certain instances, well-known or conventional details are not described in order to provide a concise discussion of embodiments of the present inventions.

It will be evident that various modifications may be made thereto without departing from the broader spirit and scope of the invention as set forth in the following claims. For example, the methods described in this document may be performed with fewer or more features/blocks or the features/blocks may be performed in differing orders. Additionally, the method(s) described in this document may be repeated or performed in parallel with one another or in parallel with different instances of the same or similar methods. While examples refer to memory and non-volatile storage media, embodiments may also be implemented with other types of storage media.

What is claimed is:

1. A computer-implemented method, comprising:
    detecting a trigger to configure a memory including a plurality of dice, each die of the plurality of dice accessed by a controller via one of a plurality of channels, each channel providing access to multiple dice, the plurality of dice including two spare dice, a first spare die of the two spare dice accessible via a first channel of the plurality of channels and a second spare die of the two spare dice accessible via a second channel of the plurality of channels; and
    in response to detecting the trigger, mapping a plurality of logical units to the plurality of dice, excluding the two spare dice, wherein the mapping includes mapping each logical unit of the plurality of logical units across multiple dice of the plurality of dice such that:
        a first set of the plurality of logical units reside on dice accessible via a first group of channels including the second channel and excluding the first channel,
        a second set of the plurality of logical units reside on dice accessible via a second group of channels including the first channel and excluding the second channel,
        the first spare die is a spare for the second set of logical units such that remapping a die of the plurality of dice mapped to the second logical units to the first spare die avoids channel stacking, and
        the second spare die is a spare for the first set of logical units such that remapping a die of the plurality of dice mapped to the first logical units to the second spare die avoids channel stacking.

2. The computer-implemented method of claim 1, further comprising:
    performing an error analysis of the plurality of dice;
    determining, using the error analysis, two dice having higher error rates than others of the plurality of dice; and
    remapping logical units that were mapped to the two dice having higher error rates to the spare dice.

3. The computer-implemented method of claim 2, wherein the remapping includes writing die addresses of the two dice having higher error rates to a data structure corresponding to spare dice.

4. The computer-implemented method of claim 3, further comprising:
    detecting an operation targeted at a portion of a logical unit;
    determining a die address of a die targeted by the operation matches one of the die addresses written to the data structure; and
    performing the operation using the die address of the spare die to which that entry in the data structure corresponds.

5. The computer-implemented method of claim 2, wherein determining two dice having higher error rates includes determining a first die having a highest error rate of dice mapped to the first set of the plurality of logical units and a second die having a highest error rate of dice mapped to the second set of the plurality of logical units, and wherein the remapping includes remapping a portion of a logical unit that was mapped to the first die having a highest error rate to the first spare die and remapping a portion of a logical unit that was mapped to the second die having a highest error rate to the second spare die.

6. The computer-implemented method of claim 1, wherein each logical unit is mapped to a group of physically contiguous dice.

7. The computer-implemented method of claim 1, wherein memory capacity of the two spare dice is omitted from memory capacity reported to a user.

8. A non-transitory computer-readable medium storing instructions, which when executed by a processing device, cause the processing device to perform a method comprising:
    computer-implemented method, comprising:
        detecting a trigger to configure a memory including a plurality of dice, each die of the plurality of dice accessed by a controller via one of a plurality of channels, each channel providing access to multiple dice, the plurality of dice including two spare dice, a first spare die of the two spare dice accessible via a first channel of the plurality of channels and a second spare die of the two spare dice accessible via a second channel of the plurality of channels; and in response to detecting the trigger, mapping a plurality of logical units to the plurality of dice, excluding the two spare dice, wherein the mapping includes mapping each logical unit of the plurality of logical units across multiple dice of the plurality of dice such that:

a first set of the plurality of logical units reside on dice accessible via a first group of channels including the second channel and excluding the first channel, a second set of the plurality of logical units reside on dice accessible via a second group of channels including the first channel and excluding the second channel, the first spare die is a spare for the second set of logical units such that remapping a die of the plurality of dice mapped to the second logical units to the first spare die avoids channel stacking, and the second spare die is a spare for the first set of logical units such that remapping a die of the plurality of dice mapped to the first logical units to the second spare die avoids channel stacking.

9. The non-transitory computer-readable medium of claim 8, the method further comprising:

performing an error analysis of the plurality of dice;

determining, using the error analysis, two dice having higher error rates than others of the plurality of dice; and remapping logical units that were mapped to the two dice having higher error rates to the spare dice.

10. The non-transitory computer-readable medium of claim 9, wherein the remapping includes writing die addresses of the two dice having higher error rates to a data structure corresponding to spare dice.

11. The non-transitory computer-readable medium of claim 10, the method further comprising:

detecting an operation targeted at a portion of a logical unit;

determining a die address of a die targeted by the operation matches one of the die addresses written to the data structure; and performing the operation using the die address of the spare die to which that entry in the data structure corresponds.

12. The non-transitory computer-readable medium of claim 9, wherein determining two dice having higher error rates includes determining a first die having a highest error rate of dice mapped to the first set of the plurality of logical units and a second die having a highest error rate of dice mapped to the second set of the plurality of logical units, and wherein the remapping includes remapping a portion of a logical unit that was mapped to the first die having a highest error rate to the first spare die and remapping a portion of a logical unit that was mapped to the second die having a highest error rate to the second spare die.

13. The non-transitory computer-readable medium of claim 8, wherein each logical unit is mapped to a group of physically contiguous dice.

14. The non-transitory computer-readable medium of claim 8, wherein memory capacity of the two spare dice is omitted from memory capacity reported to a user.

15. A system comprising:

a plurality of dice including two spare dice; and a processing device coupled to the plurality of dice via a plurality of channels, each channel providing access to multiple dice, wherein a first spare die of the two spare dice is accessible via a first channel of the plurality of channels and a second spare die of the two spare dice is accessible via a second channel of the plurality of channels, wherein the processing device executes instructions to:

detect a trigger to configure the system; and in response to detecting the trigger, map a plurality of logical units to the plurality of dice, excluding the two spare dice, wherein the mapping includes mapping each logical unit of the plurality of logical units across multiple dice of the plurality of dice such that:

a first set of the plurality of logical units reside on dice accessible via a first group of channels including the second channel and excluding the first channel, a second set of the plurality of logical units reside on dice accessible via a second group of channels including the first channel and excluding the second channel, the first spare die is a spare for the second set of logical units such that remapping a die of the plurality of dice mapped to the second logical units to the first spare die avoids channel stacking, and the second spare die is a spare for the first set of logical units such that remapping a die of the plurality of dice mapped to the first logical units to the second spare die avoids channel stacking.

16. The system of claim 15, wherein the instructions further cause the processing device to:

perform an error analysis of the plurality of dice;

determine, using the error analysis, two dice having higher error rates than others of the plurality of dice; and remap logical units that were mapped to the two dice having higher error rates to the spare dice.

17. The system of claim 16, wherein the remapping includes writing die addresses of the two dice having higher error rates to a data structure corresponding to spare dice.

18. The system of claim 17, wherein the instructions further cause the processing device to:

detect an operation targeted at a portion of a logical unit;

determine a die address of a die targeted by the operation matches one of the die addresses written to the data structure; and perform the operation using the die address of the spare die to which that entry in the data structure corresponds.

19. The system of claim 16, wherein determining two dice having higher error rates includes determining a first die having a highest error rate of dice mapped to the first set of the plurality of logical units and a second die having a highest error rate of dice mapped to the second set of the plurality of logical units, and wherein the remapping includes remapping a portion of a logical unit that was mapped to the first die having a highest error rate to the first spare die and remapping a portion of a logical unit that was mapped to the second die having a highest error rate to the second spare die.

20. The system of claim 15, wherein each logical unit is mapped to a group of physically contiguous dice.

* * * * *